United States Patent [19]

Burnett

[11] Patent Number: 5,243,294

[45] Date of Patent: * Sep. 7, 1993

[54] METHODS OF AND APPARATUS FOR DETECTING THE CHARACTER AND LOCATION OF ANOMALIES ALONG A CONDUCTIVE MEMBER USING PULSE PROPAGATION

[75] Inventor: Gale D. Burnett, Lynden, Wash.

[73] Assignee: Pipeline Profiles, Ltd., Lynden, Wash.

[*] Notice: The portion of the term of this patent subsequent to Nov. 13, 2007 has been disclaimed.

[21] Appl. No.: 782,565

[22] Filed: Oct. 25, 1991

[51] Int. Cl.⁵ .......................................... G01R 31/11
[52] U.S. Cl. .................................. 324/535; 324/527; 324/532; 324/534
[58] Field of Search ............... 324/527, 532, 533, 534, 324/535, 543; 379/2, 5, 24, 26, 30, 31

[56] References Cited

U.S. PATENT DOCUMENTS

| | | |
|---|---|---|
| 2,113,749 | 4/1938 | Statham . |
| 2,522,362 | 9/1950 | Gilbert . |
| 2,570,912 | 10/1951 | Bishop .................................. 324/532 |
| 2,602,834 | 7/1952 | Leslie et al. . |
| 2,725,526 | 11/1955 | Stringfield et al. ............. 324/533 X |
| 2,887,652 | 5/1959 | Bendayan et al. . |
| 3,600,674 | 8/1971 | Roberts et al. ................. 324/534 X |
| 3,609,533 | 9/1971 | Pardis .................................... 324/535 |
| 3,909,712 | 9/1975 | Rietz et al. . |
| 3,924,179 | 12/1975 | Dozier . |
| 4,063,161 | 12/1977 | Pardis . |
| 4,099,117 | 7/1978 | Erath . |
| 4,118,662 | 10/1978 | Weber . |
| 4,289,019 | 9/1981 | Claytor . |
| 4,291,204 | 9/1981 | Crick .................................... 324/534 |
| 4,404,514 | 9/1983 | Reichert ............................. 324/533 |
| 4,538,103 | 8/1985 | Cappon .................................. 324/534 |
| 4,739,276 | 4/1988 | Graube . |
| 4,755,742 | 7/1988 | Agoston et al. . |
| 4,829,284 | 5/1989 | Pfaff . |
| 4,970,467 | 11/1990 | Burnett ................................ 324/637 |
| 5,070,537 | 12/1991 | Ohira et al. ......................... 324/535 |

FOREIGN PATENT DOCUMENTS

3533479A1  3/1987  Fed. Rep. of Germany .

*Primary Examiner*—Gerard R. Strecker
*Assistant Examiner*—Diep Do
*Attorney, Agent, or Firm*—Hughes & Multer

[57] ABSTRACT

A method and apparatus of detecting an anomoly along an elongate, electrically conductive member comprising the steps of. An electrical pulse is so sent along the member from each of two locations towards an intersecting location between the two locations that the pulses intersect and are modified at the intersecting location. At least one of the modified pulses is analyzed to determine whether an anomoly exists at the intersecting location. The timing of at least one of the pulses is based at least in part on the propagation delay of an electrical pulse propagating between the two locations.

20 Claims, 6 Drawing Sheets

METHODS OF AND APPARATUS FOR DETECTING THE CHARACTER AND LOCATION OF ANOMALIES ALONG A CONDUCTIVE MEMBER USING PULSE PROPAGATION

RELATIONSHIP TO OTHER APPLICATIONS

This application is related to an application entitled APPLICATION AND METHOD FOR PULSE PROPAGATION ANALYSIS OF A WELL CASING OR THE LIKE and an application entitled APPARATUS AND METHOD FOR PULSE PROPAGATION ANALYSIS, both filed on Oct. 25, 1991 by Gale Burnett, which are incorporated herein by reference.

TECHNICAL FIELD

The present invention relates to an apparatus and method for analyzing conditions along a length of an elongate electrically conductive member and, more particularly, to such an apparatus and method which is particularly adapted to detect the presence and location of anomalies between two points along the length of a pipeline, such as an oil or gas pipeline, where barriers, such as rivers or lakes, render difficult the interconnection of test equipment located at these two points.

BACKGROUND OF THE INVENTION

It has been proposed in U.S. Pat. No. 4,970,467 issued Nov. 13, 1990 to Burnett, the Applicant named herein, that anomalies in a pipeline or the like may be detected by analyzing electrical pulses propagating through the pipeline. Briefly, that patent proposes sending a first electrical pulse from a first location and a second electrical pulse from a second location so that these pulses collide at a third location referred to as an intersecting point. The collision and the properties of the pipeline at the intersecting location cause a modification these pulses. By analyzing one or both of these modified pulses, one can determine the probability of an anomaly being present at the intersecting point.

The principles underlying the technology disclosed in U.S. Pat. No. 4,970,467 is basically sound; however, certain impediments exist to implementing this technology in the real world. Specifically, the apparatus for implementing this technology requires a test set-up comprising two pulse generators located adjacent to the first and second locations along the pipeline. These pulse generators must be precisely synchronized to obtain a collision of the first and second pulses generated thereby at a known, desired intersecting point. To obtain this precise triggering, a cable is normally attached between the two pulse generators.

When the pipeline extends below natural barriers such as rivers and lakes, the connection of a cable between pulse generators operating at first and second locations on either side of the barrier is highly impractical. This may also be true if the first and second locations are located on either side of man-made barriers such as highways and canals.

Another problem with the implementation of this technology is that the pulses tend to degrade while traveling between points A and B. This degradation of the pulses limits the length of the pipe that can be checked for anomalies because, at some distance, the degraded pulse can no longer be reliably analyzed.

Accordingly, while the principles underlying the technology disclosed in U.S. Pat. No. 4,970,467 are generally sound, extensive problems still exist in implementing this technology in the real world.

OBJECTS OF THE INVENTION

From the foregoing, it should be clear that a primary object of the present invention is to provide improved methods and apparatus for determining the liklihood of anomalies along the length of an elongate member such as a pipeline.

Another important, but more specific, object of the present invention is to provide apparatus and methods for determining anomalies along an elongate member exhibiting a favorable mix of the following factors:

a. detecting anomalies in a pipeline extending past a barrier such as a lake or canal;
b. easily allowing the synchronization of pulse generators operating on either side of such barriers; and
c. extending the distance between the two points on the elongate member at which pulses are applied to this member.

SUMMARY OF THE INVENTION

The above and other objects are achieved by a method of detecting an anomoly along a member comprising the steps of:(a) so sending an electrical pulse along the member from each of two locations towards an intersecting location between the two locations that the pulses intersect and are modified at the intersecting location; and (b) analyzing at least one of the modified pulses to determine whether an anomoly exists at the intersecting location. The timing of at least one of the pulses is based at least in part on the propagation delay of an electrical pulse propagating between the two locations.

In another form, a first series of pulses is sent from one of the two locations, and at least one pulse is so sent from the other of the two locations that the at least one pulse collides with one pulse of the first series of pulses at the intersecting location. Preferably, the first series of pulses is periodic, and the timing of the at least one pulse is based at least in part on the period of the first series of pulses.

Additionally, a second series of pulses may be sent from the other of the two locations. Each pulse of the second series collides with an associated pulse of the first series. In this case, each pulse of the second series is generated based on a previous pulse of the first series generated before the associated pulse.

In the preferred embodiment, each pulse of the second series is generated a calculated delay time after the previous pulse on which the pulse of the second series is based. This calculated delay time may be calculated based on the following equation:

$$t_c = T_p - 2t_{pd} - t_{sd} + \frac{2x}{v_p}, \text{ where}$$

$t_c$ is the calculated delay time;
$T_p$ is the period of the first series;
$t_{pd}$ is the propagation delay of a pulse propagating between the two points;
$t_{sd}$ is a system delay attributed to test equipment,
$x$ is the distance from the other of the two points; corresponding to the desired intersecting point; and
$v_p$ is the velocity at which a pulse propagates along the member.

The present invention may also be embodied in an apparatus for detecting an anomoly along a member comprising: (a) means for so sending an electrical pulse along the member from each of two locations towards an intersecting location between the two locations that the pulses intersect and are modified at the intersecting location; and (b) means for analyzing at least one of the modified pulses to determine whether an anomoly exists at the intersecting location. Again, the timing of at least one of the pulses is based at least in part on the propagation delay of an electrical pulse propagating between the two locations.

DETAILED DESCRIPTION OF THE PREFERRED EMBODIMENT

Figure 1:
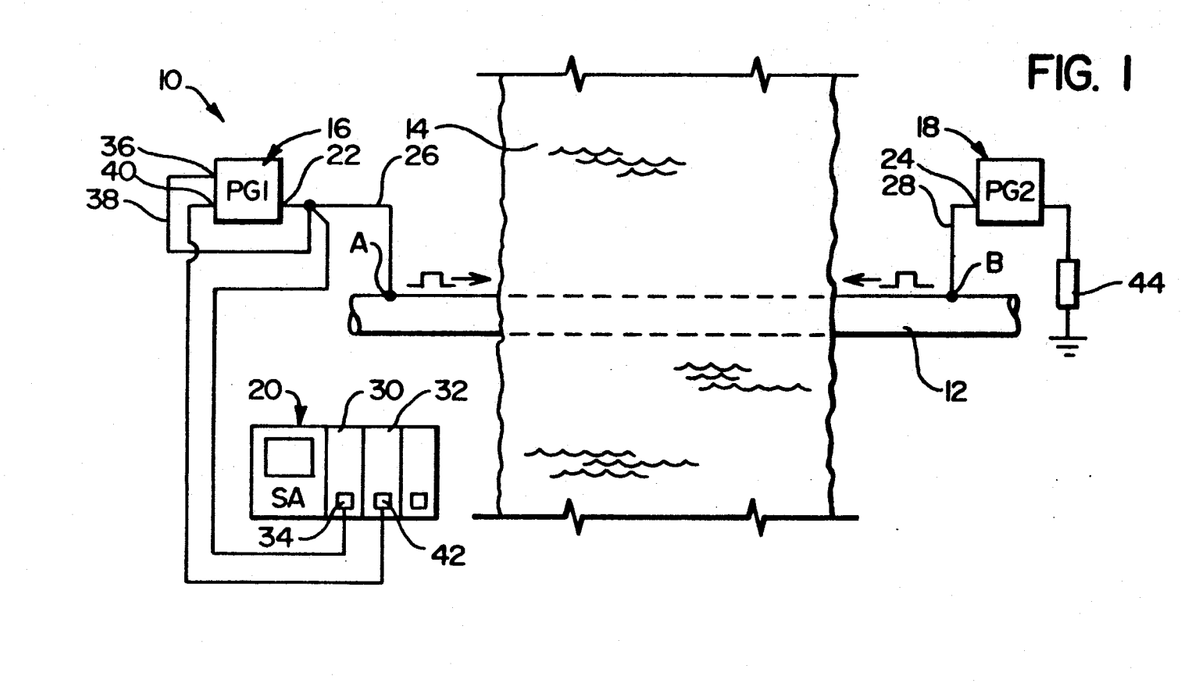
FIG. 1 is a somewhat schematic view illustrating a pipe and showing the basic process of a first embodiment of the invention.

Referring now to the drawing, FIG. 1 depicts a test apparatus 10 constructed in accordance with, and embodying, the principles of the present invention. This apparatus 10 is employed to test for anomalies along the lengthwise axis of an elongate members such as a pipeline indicated by reference character 12. The test apparatus 10 is especially well suited for testing for anomalies between points A and B along the axis of the pipeline 12 when a physical barrier such as a river 14 exists between these points A and B.

The test apparatus 10 basically comprises a first pulse generator 16 located near point A, a second pulse generator 18 located near point B, and a signal analyzer 20 also located near point A. The pulse generators 16 and 18 are both manufactured by Stanford Research and are identified as model number DG535. Output terminals 22 and 24 of the pulse generators 16 and 18 are connected to points A and B of the pipe 12 via cables 26 and 28.

The signal analyzer 20, which is manufactured by TEK and identified as model number DSA601A, contains plug-in units 30 and 32 such as model numbers 11A32 manufactured by TEK. The cable 26 connected to point A is also connected to an input terminal 34 of the signal analyzer plug-in unit 26 and to a trigger input terminal 36 of the first pulse generator 16 through a delay line 38. The purpose of this delay line 38 is to ensure that pulses generated by the first pulse generator 16 do not collide and interfere with earlier pulses sent from the second pulse generator 18. For purposes of clarity, the effects of this delay line 38 will not be shown in the drawing or discussed in further detail below. A second output terminal 40 of the pulse generator 16 is connected to an input terminal 42 of the signal analyzer plug-in unit 32.

As described in the above-referenced U.S. Pat. No. 4,970,467 issued Nov. 13, 1990 to the present inventor, which is incorporated herein by reference, the present invention may also be employed in conjunction with the known half-cell method of detecting anomalies in pipelines. In this case, an input terminal of the second pulse generator 18 is connected to a known half-cell probe 44.

Briefly, the test apparatus 10 operates in the following manner. The pulse generators 16 and 18 each generate a pulse at points A and B which are timed to propagate towards each other and meet or collide at an intersecting point between the points A and B. When these pulses collide, they interact with each other and are modified by this interaction. The modified pulses then propagate past the intersecting point to the opposite point from which they originated.

As disclosed in detail in the above-referenced U.S. Pat. No. 4,970,467, the waveform or signature of either of the pulses modified by the collision at the intersecting point may be analyzed to determine the possibility of an anomaly being present at the intersecting point. In the present case, the signature of the pulse sent from the second pulse generator 18 is analyzed at point A using the signal analyzer 20. The analysis of the waveform or signature using the signal analyzer 20 is not in itself the present invention and will be discussed herein only to the extent necessary for a complete understanding of the present invention.

The present invention primarily relates to the method by which the pulse generators 16 and 18 are synchronized. More specifically, the second pulse generator 18 is set to generate a periodic series of pulses. The first pulse generator 16 generates pulses based on the following factors: (a) the pulses generated by the second pulse generator 18; and (b) a propagation delay time $t_{pd}$ that a pulse takes to propagate along the axis between the points A and B. Based on these factors, a pulse generated by the first pulse generator 16 is timed to collide with a pulse generated at the second pulse generator 18 at a known desired intersecting point.

Additionally, by so controlling the first pulse generator 16 that it generates pulses before, at the same time, or after associated pulses generated by the second pulse generator 18, the pulses collide at a plurality of desired intersecting points spaced at intervals along the length of the pipe 12. The modified pulses associated with each intersecting point can then be recorded and analyzed to determine whether anomalies exist in the pipe 12 at these intersecting points. With the intersecting points spaced at close intervals, a cumulative picture of anomalies in the pipe 12 between the points A and B can be developed.

The present invention thereby allows the detection of anomalies between points A and B in an elongate, electrically conductive member such as pipe 12 even though a triggering cable cannot be connected between the pulse generators 16 and 18.

This timing of the pulses generated by the pulse generators 16 and 18 for one embodiment of the present invention will now be described in further detail with reference to FIGS. 2–5. A brief explanation of FIGS. 2–5 is in order at this point.

In these figures, consecutive points in time are arranged from the top towards the bottom of the page. When any of these points are related to earlier points in a periodic fashion, this relationship is indicated in the right margin. When any of these points are related to earlier points in a non-periodic fashion, such relationships are indicated in the left margin. When these points are related simply by virtue of the propagation speed $v_s$, this relationship is not shown.

Individual pulses are labeled either with an "A" or a "B" coupled with an integer. Points labeled with an "A" are generated by the first pulse generator 16 at point A, while pulses labeled with a "B" are generated by the second pulse generator 18 at point B. The integers indicate the sequence of pulses relative to other such pulses.

Finally, the letters A and B correspond to the points A and B shown in FIG. 1, while the lines between the letters A and B represents the length L of the pipe 12 between the points A and B. The intersecting points where the pulses collide are denoted by a "P" in conjunction with an integer. The integer related to each intersecting point is the same as the integer associated with pulse generated by the first pulse generator that collides at that intersecting point.

Initially, the propagation delay time $t_{pd}$ that it takes for one pulse to travel in either direction between the two testing points must be calculated. Shown in FIG. 2 is one method of determining the propagation delay time $t_{pd}$ of a pulse propagating between points A and B.

When determining the propagation delay time $t_{pd}$ between points A and B, the second pulse generator is set in a repeater mode in which, in response to a pulse $A_0$ detected through the cable 28 at point B, it generates a pulse $B_0$ and applies this pulse $B_0$ to the point B a known repeater delay time $t_r$ after the pulse $A_0$ is detected at point B. It should be noted that, in the preferred embodiment, the pulses generated by the pulse generators 16 and 18 are positive pulses; however, either or both of these pulses may be negative pulses.

Figure 2:
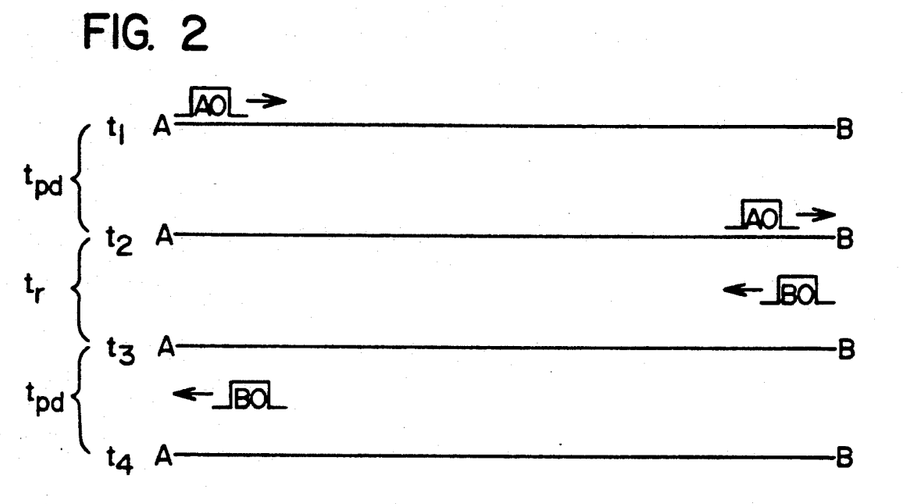
FIG. 2 depicts the timing of pulses sent from two points along the pipe to determine the propagation delay of an electrical pulse propagating from one of these points to another.

Thus, as shown in FIG. 2, the first pulse generator 16 generates the pulse $A_0$ at time $t_1$. This pulse $A_0$ propagates towards point B and arrives at point B at time $t_2$. At time $t_3$, which occurs the known repeater delay time $t_r$ after the pulse $A_0$ arrives at point B, the second pulse generator 18 generates the pulse $B_0$. This pulse $B_0$ arrives at point A at time $t_4$. The propagation delay time $t_{pd}$ may then be calculated according to the following equation (1):

$$t_{pd} = [(t_4 - t_1) - t_r]/2 \quad (1)$$

Given that the pulses $A_0$ and $B_0$, and any subsequent pulses, travel at a velocity $v_p$ of approximately one-half foot per nanosecond, the length L of the pipe 12 from point A to point B can be calculated from the propagation delay time $t_{pd}$ according to the following equation (2):

$$L = t_{pd} \times V_p \quad (2)$$

Once the propagation delay time $t_{pd}$ has been calculated, the second pulse generator 18 is then switched from its repeater mode into a free-running mode in which it generates a series of periodic pulses having a known period $T_p$. It should be noted that the width of the pulses generated by the pulse generators 16 and 18 is somewhat arbitrary, but is typically no more than 25% of the period $T_p$; however, this pulse width and its relation to the period $T_p$ are field variable and are usually optimized for a given pipe under a given set of field conditions. In the preferred embodiment, the pulse width is 2–400 nanoseconds and the period $T_p$ is 10,000 nanoseconds (10 khz frequency).

Figure 3:
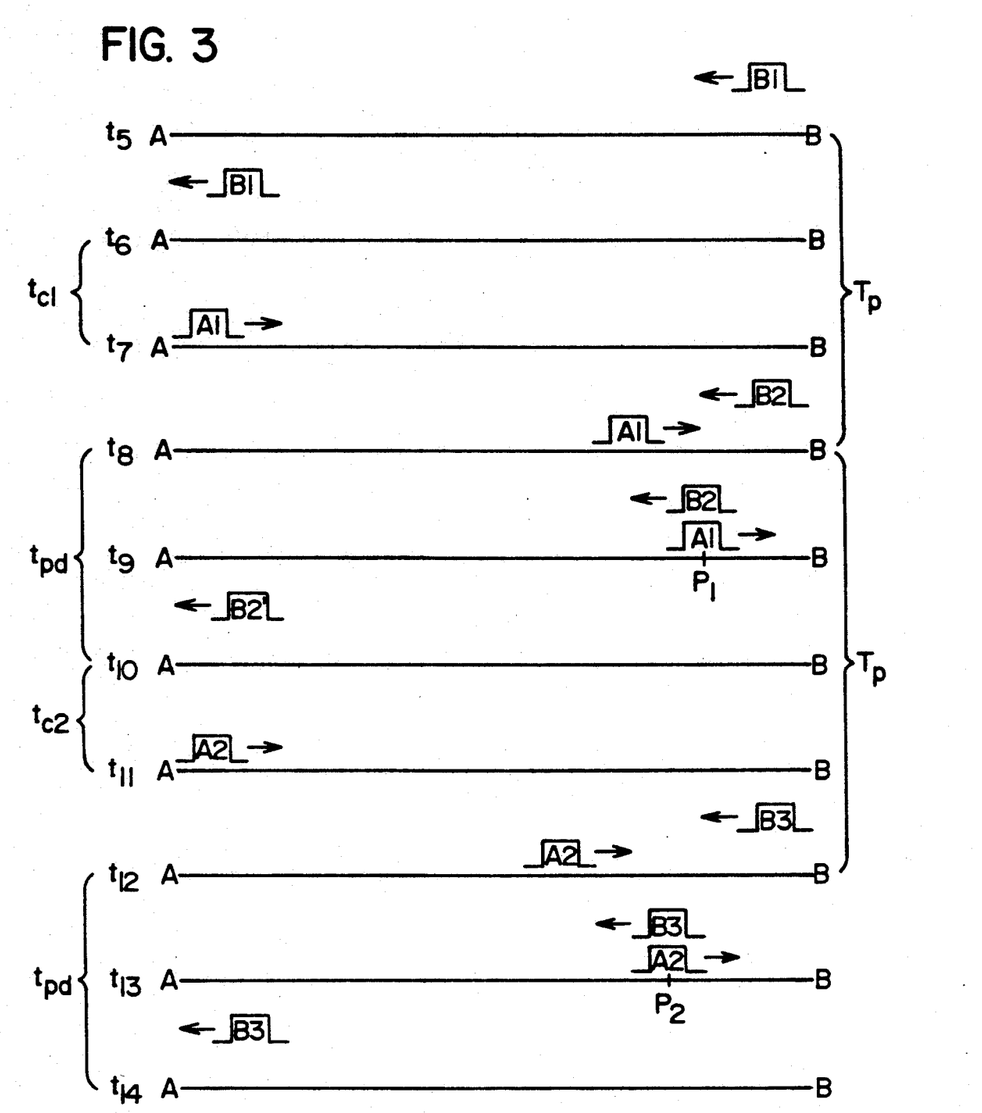
FIG. 3 depicts the timing of pulses generated according to the present invention to determine whether anomolies exist on a pipe at two points adjacent to one of the points along the pipe.

Referring now to FIG. 3, the first of the pulses in the series of pulses generated by the second pulse generator 18, pulse $B_1$, is generated at time $t_5$, propagates down the pipe 12, and arrives at point A at time $t_6$. The purposes of this pulse $B_1$ is to signal to the first pulse generator 16 that the second pulse generator 18 has started generating the series of periodic pulses and to trigger the first pulse generator to generate a first pulse $A_1$. This first pulse $B_1$ is not analyzed by the signal analyzer 20.

The first pulse generator 16 or a controller therefor is programmed to generate a pulse at the output terminal 22 a calculated delay time $t_c$ after a pulse is received at the trigger input terminal 36. This calculated delay time $t_c$ is calculated for each pulse generated by the first pulse generator 16 based on: (a) a desired intersecting pulse point at which two associated pulses are to collide; (b) the period $T_p$ between the pulses in the periodic series; (c) the propagation delay period $t_{pd}$; and (d) a systems delay time $t_{sd}$. The systems delay time $t_{sd}$ is a field variable quantity that takes into account the combined delays caused by the various test components and cables of the apparatus 10. The systems delay time $t_{sd}$ is 100 nanoseconds in the preferred embodiment.

The calculated delay time $t_c$ is calculated based on the following equation (3):

$$t_c = T_p - 2t_{pd} - t_{sd} + \frac{2x}{v_p} \quad (3)$$

where x is the distance of the desired intersecting point P from the point B and $T_p$, $t_{pd}$, $t_{sd}$, and $v_p$ are as defined above.

Referring back to FIG. 3, the first pulse generator 16 calculates an initial calculated delay time $t_{c1}$. This first pulse generator 16 then generates a pulse $A_1$ at time $t_7$, which occurs the calculated delay time $t_{c1}$ after the time $t_6$ at which the pulse $B_1$ arrived at point A. The pulse $A_1$ so generated is timed to collide with the pulse $B_2$ at a first desired intersecting point $P_1$ at time $t_9$. For the pulses $A_1$ and $B_2$ to collide at an intersecting point $P_1$ nearer to point B than to point A, the pulse $A_1$ must be sent before pulse $B_2$ is sent.

For example, assume that the period $T_p$ of the series pulses is 10,000 nanoseconds (10 khz frequency), and the propagation delay time $t_d$ is calculated from equation (1) as 800 nanoseconds. In this case, employing equation (2), it is known that the length of the pipe between points A and B is 400'. In order for the pulses $A_1$ and $B_1$ to collide at an intersecting point $P_1$ that is 10' from point B, the calculated delay time $t_{c1}$ is calculated from equation (3) as 8,340 nanoseconds. If these parameters are met, the pulse $A_1$ will collide with the pulse $B_2$ ten feet from the point B at the desired intersecting point $P_1$.

As the pulses $A_1$ and $B_2$ collide at the intersecting point $P_1$, they are modified. Modified pulse $B_2'$ is depicted at time $t_{10}$ reaching point A. In the present embodiment, the modified pulse $B_2$ is recorded and/or analyzed by the signal analyzer 20; however, it should be clear that either modified pulse may be recorded and subsequently analyzed to determine the possibility of an anomaly existing at intersecting point $P_1$. In addition to being recorded and/or analyzed, this pulse $B_2'$ is also sent to the trigger input terminal 36.

In the preferred embodiment, the signal analyzer 20 is triggered to record the modified pulse $B_2'$, and any subsequent modified pulses, by: (a) an analyzer trigger pulse generated at the output terminal 40 of the first pulse generator 16 and (b) the pulses generated by the second pulse generator 18. The analyzer trigger pulse is synchronized with the modified pulse $B_1'$. This set-up provides a stable, expanded window or view of the modified pulse $B_1'$ which can be recorded by the signal analyzer 20 for later analysis.

In order to search for anomalies along the length of the pipe 12, the intersecting point is stepped along the length of the pipe 12 between points A and B. To accomplish this, a new calculated delay time $t_{c2}$ is calculated for the pulse $A_3$. The new calculated delay time $t_{c2}$ is slightly longer than the previously calculated delay time $t_{c1}$. With this longer new time calculated delay time $t_{c2}$, the pulse $A_2$ collides with the pulse $B_3$ at an intersecting point $P_2$ that is closer to point A than the previous intersecting point $P_1$.

For example, using the parameters set forth above, the new calculated delay time $t_{c2}$ must be 8,380 nanoseconds in order for the pulses $A_2$ and $B_3$ to collide at an intersecting point $P_2$ that is 380' from point A and 20' from point B. If these parameters are met, the pulse $A_2$ will collide with the pulse $B_3$ at intersecting point $P_2$ at time $t_{13}$.

At time $t_{14}$, the modified pulse $B_3'$ reaches point A, where it is (a) recorded and/or analyzed and (b) sent to the trigger input terminal 36 to trigger the next pulse $A_3$ to be generated by the first pulse generator 16.

Figure 4:
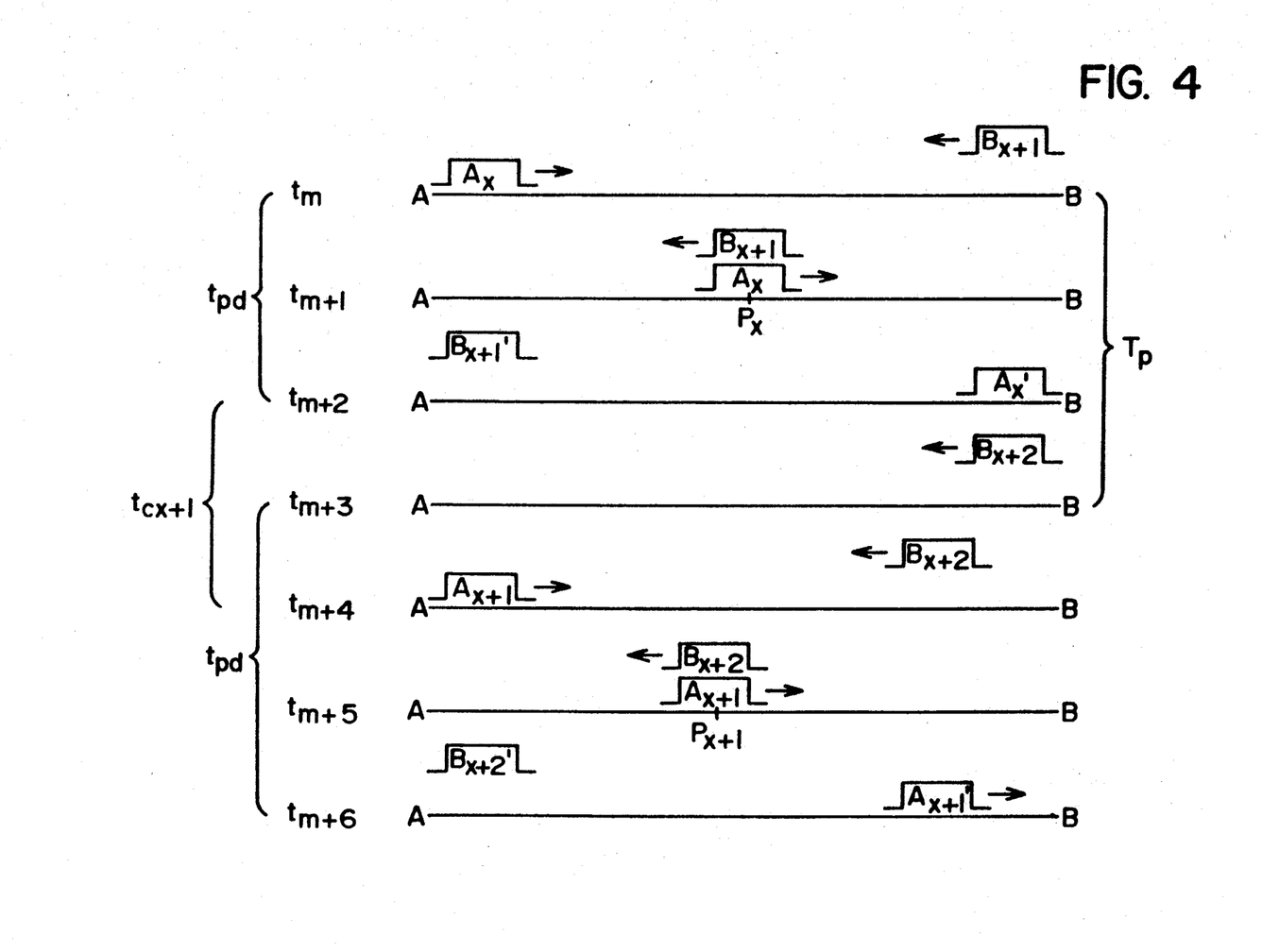
FIG. 4 depicts the timing of pulses generated according to the present invention to determine whether anomolies exist on a pipe at two points near the midpoint of the points along the pipe.

Referring now to FIG. 4, the situation is shown where the desired intersecting point $P_x$ is half-way between the points A and B. In this case, the calculated delay time $t_{cx}$ is so calculated that pulses $A_x$ and $B_{x+1}$ are sent at the same time $t_m$, the pulse $A_x$ being triggered based on the last pulse $B_x$ (not shown). These pulses $A_x$ and $B_{x+1}$ collide at the intersecting point $P_x$ at the time $t_{m+1}$. At time $t_{m+2}$, the modified pulses $A_x'$ and $B_{x+1}'$ arrive at points B and A, respectively, at which time the pulse $B_{x+1}'$ is recorded by the signal analyzer 20.

Again using the parameters set forth above, the new calculated delay time $t_{cx}$ must be 9,100 nanoseconds in order for the pulses $A_x$ and $B_{x+1}$ to collide at an intersecting point $P_x$ that is 200' from point B and 200' from point B at time $t_{m+1}$.

To obtain a collision at a desired intersecting point $P_{x+1}$ located closer to the point A than to the point B, the pulse $B_{x+2}$ must be sent before the pulse $A_{x+1}$. The calculated delay time $T_{cx+1}$ associated with pulse $A_{x+1}$ thus must be slightly longer than the delay time $T_{cx}$ associated with pulse $A_x$. Specifically, the pulse $B_{x+2}$ is generated at time $t_{m+3}$, the pulse $A_{x+1}$, which is generated the delay time $T_{cx+1}$ after the pulse $B_{x+1}$ is received at point A, is sent at time $t_{m+4}$, and these pulses $A_{x+1}$ and $B_{x+2}$ collide at time $t_{m+5}$ at the intersecting point $P_{x+1}$. Using the parameters set forth above, the new calculated delay time $t_{cx+1}$ must be 9,140 nanoseconds in order for the pulses $A_{x+1}$ and $B_{x+2}$ to collide at an intersecting point $P_{x+1}$ that is 210' from point B and 190' from point B at time $t_{m+5}$.

The modified pulse $B_{x+2}'$ arrives at point A at time $t_{m+6}$, and the pulse $A_{x+1}'$ arrives at point B slightly thereafter (not shown). The modified pulse $B_{y+2}$ is recorded and/or analyzed by the signal analyzer 20 when it is received at point A.

Figure 5:
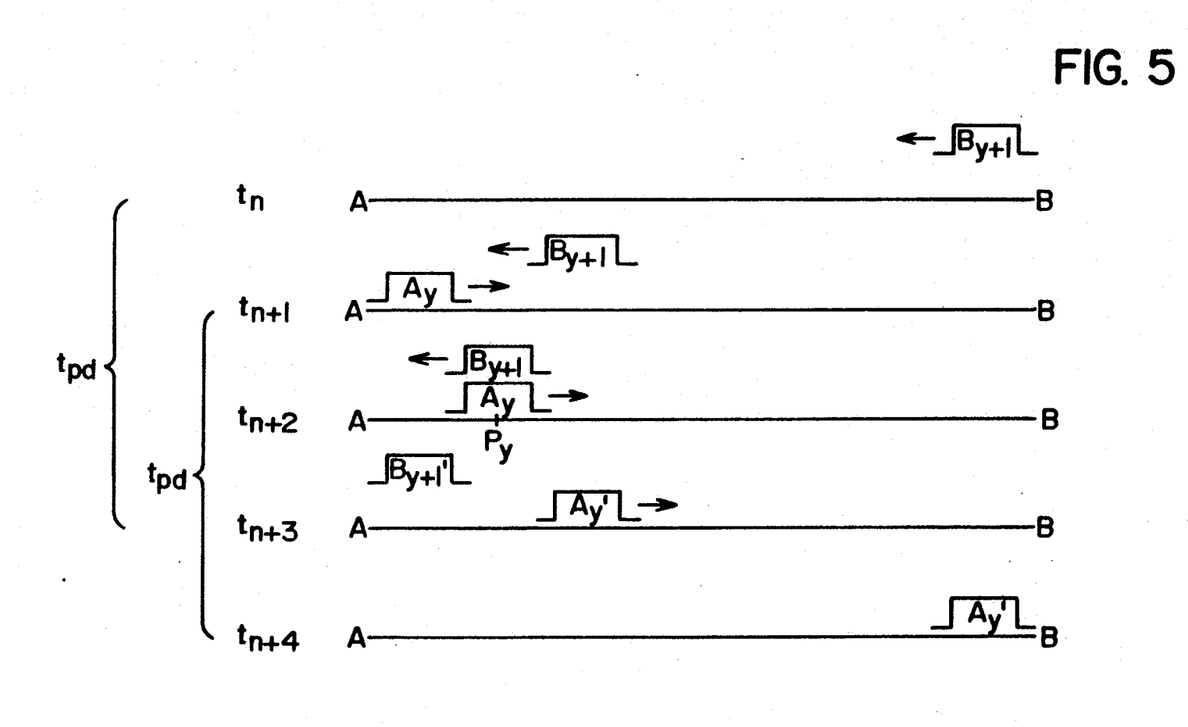
FIG. 5 depicts the timing of pulses generated according to the present invention to determine whether anomolies exist on a pipe at two points adjacent to the other of the points along the pipe.

Shown in FIG. 5 is the situation where the desired intersecting point $P_y$ is located very near the point A. In this case, the pulse $B_{y+1}$ must be sent before the pulse $A_y$, and the calculated delay time $T_{cy}$ associated with pulse $A_y$ will be relatively large. The pulse $B_{y+1}$ is thus generated at time $t_n$, the pulse $A_y$, which is generated the delay time $T_{cy}$ after a pulse $B_y$ (not shown) is received at point A, is sent at time $t_{n+1}$, and these pulses $A_y$ and $B_{y+1}$ collide at time $t_{n+2}$ at a desired intersecting point $P_y$.

Again using the parameters set forth above, the new calculated delay time $t_{cy}$ must be 9,860 nanoseconds in order for the pulses $A_y$ and $B_{y+1}$ to collide at an intersecting point $P_y$ that is 390' from point B and 10' from point B at time $t_{n+2}$.

The modified pulse $B_{y+1}$ arrives at point A at time $t_{n+3}$, and the pulse $A_y'$ arrives at point B significantly thereafter (not shown). The modified pulse $B_{y+1}'$ is recorded and/or analyzed by the signal analyzer 20 when it is received at point A.

In this manner, the waveforms associated with the various intersecting points that are stored by the signal analyzer 20 may be analyzed to obtain a composite picture of the presence or absence of anomalies along the pipe 12 between the points A and B.

While the above-described process started with an intersecting point near point B and moved in ten foot increments towards point A, it should be clear that the starting point is arbitrary and the minimum distance between consecutive intersecting point is limited only by the accuracy of the test equipment used.

Figure 6:
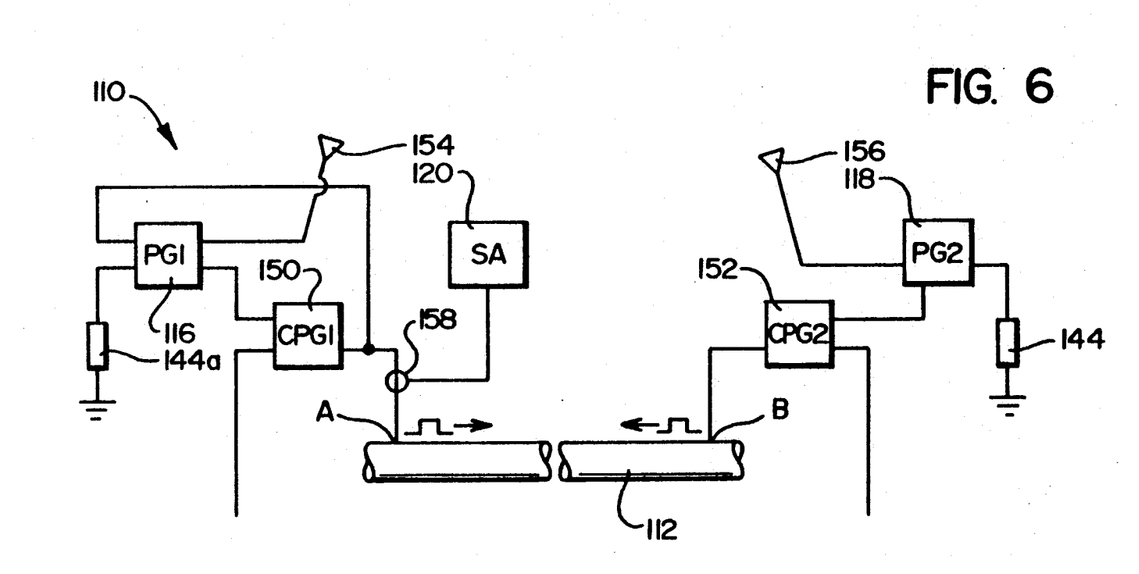
FIG. 6 is a somewhat schematic view illustrating a pipe and showing a basic process of a second embodiment of the present invention.

Shown in FIG. 6 is a test apparatus 110 of a second embodiment of the present invention. This apparatus 110 contains components similar to those employed in the test apparatus 10 of the first embodiment. Components of the second embodiment that are the same as those in the first embodiment will be given the same reference character plus 100 and will be discussed further below only to the extent necessary for a complete understanding of this second embodiment.

In this apparatus 110, first and second current pulse generators 150 and 152 and first and second satellite receiving antennas 154 and 156 are provided.

The current pulse generators 150 and 152 are, for example, the ENI 240L power amplifier currently available on the market. The first current pulse generator 150 is connected between the first pulse generator 116 and the point A. The second current pulse generator 152 is similarly connected between the second pulse generator 118 and the point B. Instead of providing pulses directly into the pipe 112, the pulse generators 116 and 118 generate pulses which turn on and off the current pulse generators 150 and 152.

The current pulse generators 150 and 152 thus essentially amplify the pulses generated by the pulse generators 116 and 118 by converting the voltage pulses generated thereby into high power current pulses. These amplified pulses, which may reach a level of 200A, are then applied to the pipe 112. So amplified, the pulses travel along the pipe 112 a distance of from 5 to 10 miles, which is significantly farther than the distance traveled by the un-amplified pulses.

In this apparatus 110, the signal analyzer 120 employs a current transformer 158 to detect and record the pulses at point A. The timing of the pulses generated by the current pulse amplifiers 150 and 152 is the same as the timing of the pulses generated by the pulse generators 16 and 18 of the first embodiment 10 and depicted in FIGS. 2-5.

The satellite receiving antennas 154 and 156 receive timing and location signals from an orbiting satellite (not shown). These timing and location signals may be used to synchronize the pulse generators located at points A and B. In some situations, these signals may be used to calculate the absolute locations of the points A and B with sufficient accuracy to estimate with a high degree of accuracy both: (a) the distance L of the pipe 112 between the two points A dna B; and (b) the propagation delay period $T_{pd}$ of an electrical pulse propagating from point A to point B. In this case, the step of determining the propagation delay time $t_{pd}$ using formula (1) and/or the step of determining the distance according to formula (2) may be omitted.

From the foregoing, it should be clear that the present invention may be embodied in forms other than the one disclosed above without departing from the spirit or essential characteristics of the present invention. The above-described embodiment is therefore to be considered in all respects illustrative and not restrictive, the scope of the invention being indicated by the appended claims rather than the foregoing description. All changes that come within the meaning and scope of the claims are intended to be embraced therein.

I claim:

1. A method of detecting an anomoly along a member comprising the steps of:
   a. so sending an electrical pulse along the member from each of two locations towards an intersecting location between the two locations that the pulses intersect and are modified at the intersecting location; and
   b. analyzing at least one of the modified pulses to determine whether an anomoly exists at the intersecting location; wherein
   the timing of at least one of the pulses is based at least in part on the propagation delay of an electrical pulse propagating between the two locations.

2. A method as recited in claim 1, in which:
   a. a first series of pulses is sent from one of the two locations;
   b. at least one pulse is so sent from the other of the two locations that the at least one pulse collides with one pulse of the first series of pulses at the intersecting location.

3. A method as recited in claim 2, in which:
   a. the first series of pulses is periodic; and
   b. the timing of the at least one pulse is based at least in part on the period of the first series of pulses.

4. A method as recited in claim 2, in which:
   a. a second series of pulses is sent from the other of the two locations, where each pulse in the second series is associated with a pulse in the first series;
   b. each pulse of the second series collides with the pulse associated therewith in the first series; and
   c. any given pulse in the second series is generated based on a previous pulse of the first series generated before the pulse associated with the given pulse.

5. A method as recited in claim 4, in which each pulse of the second series is generated a calculated delay time after the previous pulse on which the pulse of the second series is based.

6. A method as recited in claim 5, in which the calculated delay time is calculated based on a desired intersecting point.

7. A method as recited in claim 6, in which the calculated delay time is calculated based on the following equation:

$$t_c = T_p - 2t_{pd} - t_{sd} + \frac{2x}{v_p},$$

where tc is the calculated delay time, Tp is the period of the first series, tpd is the propagation delay of a pulse propagating between the two points, tsd is a system delay attributed to test equipment, x is the distance from the other of the two points corresponding to the desired intersecting point, and vp is the velocity at which a pulse propagates along the member.

8. A method of detecting an anomaly between first and second locations along a member having a lengthwise axis comprising the steps of:
   a. determining a propagation delay period that an electrical pulse takes to propagate along the axis between the two points;
   b. sending a first periodic series of electrical pulses from the first location towards the second location;
   c. sending at least one electrical pulse from the second location towards the first location, the pulse sent from the second location intersecting one of the pulses sent from the first location at an intersecting location, where the timing of the pulse sent from the second location is based on:
      i. the period of the series of pulses sent from the first location, and
      ii. the propagation delay period; and
   d. analyzing at least one of the pulses that intersect at the intersecting location to ascertain whether an anomoly exists at the intersecting location.

9. A method as recited in claim 8, in which;
   a. a second series of pulses are sent from the second location, the pulses of the second series being timed to intersect one of the pulses of the first series at different intersecting locations; and
   b. at least one of the pulses from each intersecting location is analyzed to ascertain whether an anomoly exists at each of the intersecting locations.

10. A method as recited in claim 9, in which each pulse of the second series is generated based on a previous pulse of the first series generated before the associated pulse.

11. A method as recited in claim 10, in which each pulse of the second series is generated a calculated delay time after the previous pulse on which the pulse of the second series is based.

12. A method as recited in claim 11, in which the calculated delay time is calculated based on a desired intersecting point.

13. A method as recited in claim 12, in which the calculated delay time is calculated based on the following equation:

$$t_c = T_p - 2t_{pd} - t_{sd} + \frac{2x}{v_p},$$

where $t_c$ is the calculated delay time, $T_p$ is the period of the first series, $t_{pd}$ is the propagation delay of a pulse propagating between the two points, $t_{sd}$ is a system delay attributed to test equipment, x is the distance from the other of the two points corresponding to the desired intersecting point, and $v_p$ is the velocity at which a pulse propagates along the member.

14. An apparatus for detecting an anomoly along a member comprising:
   a. means for so sending an electrical pulse along the member from each of two locations towards an intersecting location between the two locations that the pulses intersect and are modified at the intersecting location; and
   b. means for analyzing at least one of the modified pulses to determine whether an anomoly exists at the intersecting location; wherein
the timing of at least one of the pulses is based at least in part on the propagation delay of an electrical pulse propagating between the two locations.

15. An apparatus as recited in claim 14, in which the means for sending an electrical pulse along the member from each of two locations comprises:
   a. first means for sending at least one pulse from a first of the two locations;
   b. second means for so sending a first series of pulses from a second of the two locations that the at least one pulse collides with one pulse of the first series of pulses at the intersecting location.

16. An apparatus as recited in claim 15, in which:
a. the first series of pulses is periodic; and
b. the timing of the at least one pulse is based at least in part on the period of the first series of pulses.

17. An apparatus as recited in claim 16, in which:
   a. the first means sends a second series of pulses, where each pulse in the second series is associated with a pulse in the first series;
   b. each pulse of the second series collides with the pulse associated therewith in the first series; and
   c. any given pulse in the second series is generated based on a previous pulse of the first series generated before the pulse associated with the given pulse.

18. An apparatus as recited in claim 17, means for calculating a calculated delay time for each pulse of the second series, where each pulse of the second series is sent the calculated delay time after the previous pulse on which the pulse of the second series is based.

19. An apparatus as recited in claim 18, in which the calculated delay time is calculated based on a desired intersecting point.

20. An apparatus as recited in claim 19, in which the calculated delay time is calculated based on the following equation:

$$t_c = T_p - 2t_{pd} - t_{sd} + \frac{2x}{v_p},$$

where $t_c$ is the calculated delay time, $T_p$ is the period of the first series, $t_{pd}$ is the propagation delay of a pulse propagating between the two points, $t_{sd}$ is a system delay attributed to test equipment, x is the distance from the other of the two points corresponding to the desired intersecting point, and $v_p$ is the velocity at which a pulse propagates along the member.

* * * * *